(12) United States Patent
Todoko et al.

(10) Patent No.: US 10,366,870 B2
(45) Date of Patent: Jul. 30, 2019

(54) CYLINDRICAL SPUTTERING TARGET AND PROCESS FOR PRODUCING THE SAME

(71) Applicant: TOSOH CORPORATION, Shunan-shi, Yamaguchi (JP)

(72) Inventors: Shigehisa Todoko, Tokyo (JP); Kimiaki Tamano, Ayase (JP); Kenichi Itoh, Ayase (JP); Tetsuo Shibutami, Ayase (JP)

(73) Assignee: TOSOH CORPORATION, Shunan-shi, Yamaguchi (JP)

( * ) Notice: Subject to any disclaimer, the term of this patent is extended or adjusted under 35 U.S.C. 154(b) by 452 days.

(21) Appl. No.: 14/979,768

(22) Filed: Dec. 28, 2015

(65) Prior Publication Data

US 2016/0141159 A1    May 19, 2016

Related U.S. Application Data

(62) Division of application No. 12/997,043, filed as application No. PCT/JP2009/060553 on Jun. 9, 2009, now abandoned.

(30) Foreign Application Priority Data

Jun. 10, 2008    (JP) ................................. 2008-152061

(51) Int. Cl.
*C23C 14/34*    (2006.01)
*H01J 37/34*    (2006.01)
*C23C 14/08*    (2006.01)

(52) U.S. Cl.
CPC ........ *H01J 37/3491* (2013.01); *C23C 14/081* (2013.01); *C23C 14/086* (2013.01);
(Continued)

(58) Field of Classification Search
CPC ................... C23C 14/3407; C23C 14/3414
See application file for complete search history.

(56) References Cited

U.S. PATENT DOCUMENTS 3,769,007 A    10/1973   Stokes, Jr. et al.
4,356,072 A    10/1982   Saito et al.
(Continued)

FOREIGN PATENT DOCUMENTS

DE    102004060423 A1    6/2006
DE    102005020250 A1    11/2006
(Continued)

OTHER PUBLICATIONS

Japanese Office Action dated Jun. 18, 2013 in Application No. 2009-107610.
(Continued)

*Primary Examiner* — Jason Berman
(74) *Attorney, Agent, or Firm* — Sughrue Mion, PLLC

(57) ABSTRACT

Provided is a cylindrical ceramic sputtering target, which significantly reduces the occurrence of a crack, a chip, extraordinary discharge and a nodule.
By filling a molten bonding material in a cavity defined by a cylindrical ceramic target material and a cylindrical base material, starting cooling the molten bonding material from its one end toward its other end in a cylindrical axial direction in sequence, and further filling the molten bonding material in the cavity during cooling, a cylindrical ceramic sputtering target is manufactured so as to be characterized in that as observed by an X-ray radiograph of the bonding material, the total area of portions where no bonding material exists is 10 cm$^2$ or less per 50 cm$^2$ of X-ray radiograph area, and the maximum area of the portions where no bonding material exists is 9 cm$^2$ or less.

3 Claims, 1 Drawing Sheet

(52) U.S. Cl.
CPC ...... *C23C 14/3407* (2013.01); *C23C 14/3414* (2013.01); *H01J 37/3426* (2013.01)

(56) References Cited

U.S. PATENT DOCUMENTS

| | | | |
|---|---|---|---|
| 4,744,506 | A | 5/1988 | Thornton |
| 5,230,462 | A * | 7/1993 | Vascak ................ B23K 1/0016 228/222 |
| 5,338,425 | A | 8/1994 | Mishima et al. |
| 5,354,446 | A | 10/1994 | Kida et al. |
| 5,593,082 | A | 1/1997 | Ivanov et al. |
| 6,214,131 | B1 | 4/2001 | Hua |
| 6,719,034 | B2 | 4/2004 | Heck et al. |
| 2006/0151321 | A1 | 7/2006 | Itoh et al. |
| 2007/0062809 | A1 | 3/2007 | Nolette et al. |
| 2007/0074969 | A1 | 4/2007 | Simpson et al. |
| 2008/0063889 | A1 * | 3/2008 | Duckham ............ B23K 1/0006 428/615 |

FOREIGN PATENT DOCUMENTS

| | | |
|---|---|---|
| DE | 102005029221 A1 | 12/2006 |
| DE | 102006009749 A1 | 9/2007 |
| EP | 0070899 B1 | 7/1987 |
| EP | 0522369 A1 | 1/1993 |
| EP | 1186682 A2 | 3/2002 |
| EP | 1216772 A2 | 6/2002 |
| GB | 1585823 A | 5/1978 |
| JP | 58-500174 A | 2/1983 |
| JP | 5-86465 A | 4/1993 |
| JP | 05-222527 A | 8/1993 |
| JP | 05-230645 A | 9/1993 |
| JP | 8-60351 A | 3/1996 |
| JP | 3618005 B2 | 2/2005 |
| JP | 2005-281862 A | 10/2005 |
| WO | 82/02725 A1 | 8/1982 |
| WO | 2006/063721 A1 | 6/2006 |
| WO | 2007110172 A1 | 10/2007 |
| WO | 2008150686 A1 | 12/2008 |

OTHER PUBLICATIONS

European Search Report dated Oct. 27, 2011, issued in corresponding Application No. 09762490.2-1215.
Japanese Standards Association, JIS Z 3104, Japanese Industrial Standard, Methods of radiographic examination for welded joints in steel, Feb. 1, 1995, 32 pgs. total.
Japanese document by M. Mihara, 2004, pp. 28-32 (3 pgs. total).
Yoshikazu Yokono, "Nondestructive Testing Methods and their Characteristics", pp. 18-21 (no apparent publication date).
Sheet without title with 3 figures ("Horizontal Sectional View", "Vertical Sectional View", "External view"), 1 pg. total (no publication date).
Communication dated May 19, 2016, issued by the European Patent Office in corresponding European Application No. 09762490.2.
Communication dated Jun. 23, 2016, from the European Patent Office in counterpart European Application No. 09762490.2.
Masayuki Mihara; "Technology for the Inspection of Piping by Means of Radiographic Testing," Special 1: Measures to Prevent the Deterioration of Piping and Recent Test Solutions ; 9 pages total.
Yoshikazu Yokono "Nondestructive Testing Methods and their Characteristics"; Lecture on Practical Applications; May 1, 1990; 10 pages total.
S. V. Stankus et al.: "The density and thermal expansion of eutectic alloys of lead with bismuth and lithium in condensed state" Journal of Physics: Conference Series 98 (2008) Jun. 2017; 9 pages total.

* cited by examiner

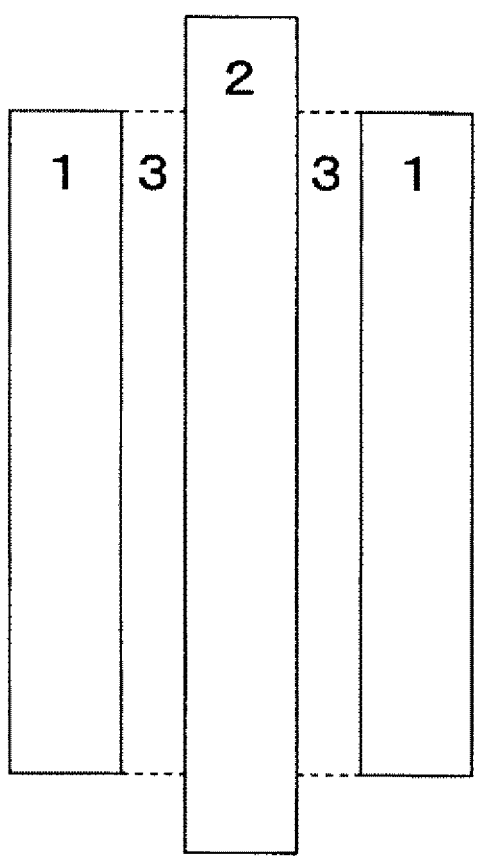

CYLINDRICAL SPUTTERING TARGET AND PROCESS FOR PRODUCING THE SAME

This is a divisional of application Ser. No. 12/997,043 filed Dec. 9, 2010, which is a National Stage of International Application No. PCT/JP2009/060553 filed Jun. 9, 2009, claiming priority based on Japanese Patent Application No. 2008-152061 filed Jun. 10, 2008, the contents of all of which are incorporated herein by reference in their entirety.

TECHNICAL FIELD

The present invention relates to a cylindrical sputtering target used in a magnetron rotary cathode sputtering apparatus etc, and a process for producing the same.

BACKGROUND ART

A magnetron rotary cathode sputtering apparatus has a magnetic field-generating device on the inside of a cylindrical sputtering target and is designed to carry out sputtering while cooling from the inside of the target and rotating the target, and the entire surface of the target material undergoes erosion and is uniformly shaved off, whereby it is possible to obtain a remarkably high target utilization ratio (at least 60%) as compared with the utilization ratio (from 20 to 30%) of a conventional planar magnetron sputtering apparatus. Further, by rotating the target, it is possible to input a large power per unit area as compared with a conventional planar magnetron sputtering apparatus, whereby a high film deposition rate can be obtained (see Patent Document 1).

As the process for producing a ceramic target used in a magnetron rotary cathode sputtering apparatus, there have known, e.g. a process for forming a target layer on an outer peripheral side of an cylindrical base material by a plasma spray method (see Patent Document 2), and a process for filling powder in an outer peripheral side of an cylindrical base material, and forming and bonding a target by a hot isostatic press (HIP) (see Patent Document 3).

However, an arc spray method and an HIP method not only require an expensive apparatus to carry out these methods and a large operating cost, but also are uneconomical since a cylindrical base material is made integrally with a cylindrical target material, making it difficult to reuse the cylindrical base material. Further, these methods are likely to be subjected to peeling or cracking attributable to the difference in the thermal expansion coefficient between both materials.

As the process for producing a ceramic target at a low cost, it has been strongly desired to develop a process for bonding a separately produced cylindrical target material made of a ceramic sintered body by means of a bonding material, such as a solder material. Such a desired process has advantages of, e.g. being capable of obtaining a quality film and a high production yield since a ceramic sintered body having a high density is usable in comparison with an arc spray method and an HIP method. As the process for producing a cylindrical ceramic sputtering target by means of a solder material, there has been known a process for sealing one end of each of a cylindrical target material and a cylindrical base material and introducing the cylindrical base material into the cylindrical target material with a solder material in a molten state being put therein (see Patent Document 4).

However, this method has caused a decrease in volume attributable to a phase change of the solder material from a liquid state to a solid state, and a decrease in volume attributable to cooling from the melting point of the solder material to normal temperature, whereby the occurrence of bonding layer defect attributable to such a decrease in volume has made thermal conduction poor, has caused a crack and a chip, or has generated extraordinary discharge due to poor electrical conduction in some cases. Further, this method has produced a needle-like protrusion called a nodule during sputtering, whereby extraordinary discharge is generated or particles are produced in some cases. For example, in a case where the solder material is made of generally used In, the volume decreases by 2.7% when the solder material is solidified at 156.6° C., the volume decreases by 1.2% when the solder material is cooled from 156.6° C. to 25° C., and the volume finally decreases by 3.9%. It should be noted that such a cylindrical ceramic target material generally has a smaller thermal expansion coefficient than a cylindrical base material. For this reason, when a bonding material is cooled from its melting point to normal temperature, the volume of a cavity defined by a cylindrical ceramic target material and a cylindrical base material is increased to causes bonding defects beyond expectation based on such a decrease in volume of the above-mentioned solder material made of In. These phenomena are not problematic in a conventional planar sputtering target since even if the volume of the bonding material is deceased, the distance between the planar target material and the planar base material is made narrower accordingly. These phenomena have a problem inherent to a cylindrical sputtering target because of being caused only in such a cylindrical sputtering target. Such a cylindrical sputtering target has been liable to cause a problem of a crack, a chip, extraordinary discharge and a nodule attributable to bonding layer defect since a larger power per unit area is input as compared with such a planar sputtering target.

As a method for inspecting the bonded state of a ceramic material or a metal material when such a material is bonded by means of a bonding material, there has been known a method for applying an X-ray to one side of an object to be measured, detecting a transmitted X-ray on the other side and determining the presence and absence of a bonding material based on a difference in X-ray absorption in respective parts of the object to be measured. No review has been made on whether the above-mentioned problem inherent to a cylindrical sputtering target, i.e. the occurrence of a crack, a chip, extraordinary discharge and a nodule is relevant to the state of a bonding layer in the cylindrical sputtering target, which is assumed not to be identified by the other methods.

PRIOR ART REFERENCE

Patent Document

Patent Document 1: JP-A-58-500174
Patent Document 2: JP-A-05-222527
Patent Document 3: JP-A-05-230645
Patent Document 4: Japanese Patent No. 3618005

SUMMARY OF THE INVENTION

Object to be Accomplished by the Invention

It is an object of the present invention to provide a cylindrical ceramic sputtering target, which significantly reduces the occurrence of a crack, a chip, extraordinary discharge and a nodule, and a process for producing the same.

Means to Accomplish the Object

The present inventors have conducted an extensive study to accomplish the above-mentioned object. As a result, they have accomplished the present invention based on the finding that it is possible to significantly reduce the occurrence of bonding layer defect by filling a molten bonding material in a cavity defined by a cylindrical ceramic target material and a cylindrical base material, starting cooling the molten bonding material from its one end toward its other end in a cylindrical axial direction in sequence, and further filling the molten bonding material in the cavity.

Further, the inventors have conducted an extensive study, focusing attention on the relationship between the occurrence of a crack, a chip, extraordinary discharge and a nodule, and the state of a bonding layer in a cylindrical sputtering target, which is identified by means of an X-ray radiograph. As a result, they have accomplished the present invention based on the finding that it is possible to significantly reduces the occurrence of a crack, a chip, extraordinary discharge and a nodule by controlling, in a sputtering target including a bonding layer formed by solidifying a molten bonding material, the total area of portions where no bonding material exists and the maximum area of the portions where no bonding material exists, the total area and the maximum area being observable by an X-ray radiograph.

The present invention provides a cylindrical ceramic sputtering target, which has a bonding material filled in a cavity defined by a cylindrical ceramic target material and a cylindrical base material, characterized in that as observed by an X-ray radiograph of the bonding material, the total area of portions where no bonding material exists is 10 cm$^2$ or less per 50 cm$^2$ of X-ray radiograph area, and the maximum area of the portions where no bonding material exists is 9 cm$^2$ or less.

The present invention also provides a process for producing a cylindrical ceramic sputtering target, which has a bonding material filled in a cavity defined by a cylindrical ceramic target material and a cylindrical base material, characterized in that the process includes filling a molten bonding material in the cavity, starting cooling the molten bonding material from its one end toward its other end in a cylindrical axial direction in sequence, and further filling the molten bonding material in the cavity during cooling.

Effects of the Invention

In accordance with the present invention, it is possible to provide a cylindrical sputtering target, which significantly reduces the occurrence of a crack, a chip, extraordinary discharge and a nodule. By employing the target according to the present invention, it is possible to attain film deposition in a transparent conductive film etc. with a high target utilization ratio and with a high film deposition rate.

BRIEF DESCRIPTION OF THE DRAWINGS

The FIGURE is a cross-sectional view of a cylindrical sputtering target according to the present invention, taken along a plane containing the central axis thereof.

MODE FOR CARRYING OUT THE INVENTION

Now, the present invention will be described in detail.

In the target according to the present invention, the cavity defined by a cylindrical ceramic target material and a cylindrical base material means a portion indicated by reference numeral 3 in the FIGURE, where a bonding material is filled therein.

The X-ray radiograph of the bonding material according to the present invention is taken for the purpose of inspecting defect in the bonding material. For example, the X-ray radiograph may be taken by applying an X-ray from outside a cylindrical sputtering target by means of an X-ray irradiation system, and recording an image on a radiographic film affixed on an inner side of the cylindrical base material. A plurality of radiographic films may be used to record images, taking into account the curvature of the cylindrical sputtering target.

In an X-ray radiograph of the bonding material, the total area of portions where no bonding material exists may be found by various kinds of methods. In particular, it is preferred in terms of simplicity and accuracy that a taken X-ray radiograph be recorded in a digital format, and a commercially available image analysis software be employed for image analysis.

The cylindrical ceramic sputtering target according to the present invention is characterized in that the total area of portions where no bonding material exists is 10 cm$^2$ or less per 50 cm$^2$ of X-ray radiograph area. By reducing the defect in a bonding layer to such a value, it is possible to reduce the occurrence of a crack, a chip and extraordinary discharge etc. attributable to poor thermal conduction or poor electrical conduction. The total area is preferably 2 cm$^2$ or less per 50 cm$^2$ of X-ray radiograph area, more preferably 1 cm$^2$ or less per 50 cm$^2$ of X-ray radiograph area.

In the X-ray radiograph of the bonding material, the maximum area of the portions where no bonding material exists may be measured in a similar way by the above-mentioned method. The cylindering sputtering target according to the present invention is characterized in that the maximum area of the portions where no bonding material exists is 9 cm$^2$ or less as observed by an X-ray radiograph. By reducing the maximum area of the defect in the bonding layer to such a value, it is possible to reduce the occurrence of a crack, a chip, extraordinary discharge etc. due to poor thermal conduction or poor electrical conduction attributable to the defect. The maximum area of the portions where no bonding material exists is preferably 1 cm$^2$ or less. In the present invention, when a single cylindrical sputtering target contains a plurality of portions where no bonding material exists, the maximum area means the maximum value among the area values obtained by finding the areas of the respective portions.

The volume of the cavity at the melting point of the bonding material means a volume in such a state that the bonding material can be filled therein in a molten state at the melting point. The value of the volume of the cavity may be found based on the melting point of the bonding material, and the thermal expansion coefficient and the dimensions of each of the cylindrical target material and a cylindrical base material. When the cylindrical target material is made of a plurality of parts, and when an intermediate member etc. is inserted between adjacent divided parts, the value of the cavity is found, regarding the entire volume containing such an intermediate member as a single cylindrical target.

On the other hand, the volume of the bonding material that has been filled in the cavity and has a temperature of 25° C. may be found by dividing an increased weight attributable to the filling of the bonding material by the density of the bonding material at 25° C.

In other words, the proportion of both volumes may be calculated according to the following formula:

Volume proportion (%)=(the volume of the bonding material that has been filled in the cavity and has a temperature of 25° C.)/(the volume of the cavity at the melting point of the bonding material)×100

Heretofore, even if the bonding material is ideally filled without containing foams, the proportion of both volumes has had a value of from 94 to 96% at most because of a density difference between the bonding material in a liquid phase (molten) state and the bonding material in a cooled solid state, and thermal expansion, although the proportion varies according to what the bonding material is made of. The proportion has been actually a lower value than the above-mentioned values since foams are involved during filling.

However, the cylindrical sputtering target according to the present invention is characterized in that the proportion of both volumes is at least 96%. It is possible to reduce the occurrence of a crack, a chip, extraordinary discharge, a nodule etc.

caused by poor thermal conduction or poor electrical conduction attributable to defect in the bonding layer by reducing the occurrence of the defect in the bonding layer up to a high volume proportion that has not been attained heretofore as described above. The proportion of both volumes is preferably at least 98%, more preferably at least 100%.

In the target according to the present invention, both of the total area and the maximum area of the portions where no bonding material exists as observed by an X-ray radiograph satisfy the above-mentioned conditions as described above. The target according to the present invention preferably satisfies the above-mentioned volume proportion as well. Such a cylindrical sputtering target can further reduce the occurrence of a crack, a chip, extraordinary discharge and a nodule.

As the bonding material, materials generally employed as a solder material are applicable. The bonding material is preferably made of a solder material having a low melting point. Specific examples of the material include In, an In alloy, Sn and a Sn alloy. The bonding material is preferably made of In and an In alloy.

As the cylindrical ceramic target material, various ceramic materials are applicable. The target material may be, for example, an oxide, which contains as main component at least one selected from the group consisting of In, Sn, Zn, Al, Ta, Nb and Ti. Specific examples include ITO (indium tin oxide), AZO (aluminum zinc oxide), IZO (indium zinc oxide), $Ta_2O_5$, $Nb_2O_5$ and $TiO_2$. In particular, ITO and AZO are preferred as the cylindrical ceramic target material according to the present invention since such materials are susceptible to the occurrence a crack and a chip and since the target is employed for the purpose of producing a flat panel display having a problem of occurrence of a nodule.

Examples of the cylindrical base material include Cu, Ti, Al, Mo, an alloy containing at least one of these metals, and SUS. The cylindrical base material preferably has a proper thermal conduction, electric conduction and strength. Among them, Ti and SUS are preferred as the cylindrical base material.

The cylindrical ceramic sputtering target according to the present invention may be produced by the method according to the present invention.

As the method for filing a molten bonding material in the cavity defined by the cylindrical base material and the cylindrical target material, there are following method.

Examples include a method for disposing a cylindrical target material outside a cylindrical base material, followed by sealing a lower portion of the gap between the cylindrical base material and the cylindrical target material and pouring a molten bonding material in the gap from an upper portion of the gap, and a method for sealing one end each of a cylindrical target material and a cylindrical base material, and putting the cylindrical base material in the cylindrical target material where a molten bonding material has been introduced.

When filling a molten bonding material or after filling a molten bonding material, it is preferred to vibrate the molten bonding material. In this way, the bonding material sufficiently spreads in the cavity defined by the cylindrical base material and the cylindrical target material without containing foams, whereby the bonding material can be filled with a higher proportion. The given vibration has an acceleration of 0.05 G or more, preferably at least 0.1 G, more preferably at least 1 G. The vibration has an amplitude of at least 0.01 mm, preferably at least 0.03 mm. Although there are no upper limits to the vibration acceleration and the vibration amplitude from the point of view of the purpose for filing the bonding material with a high proportion, the vibration acceleration and the vibration amplitude are preferably 200 G or less and 1 mm or less, respectively, since it is likely that strong vibration subjects the cylindrical target material to positional shift or the bonding material leaks from the sealed portion.

Although there is no limitation to the method for vibrating the bonding material, a vibration table or a vibrator may be employed for example. In order to prevent the cylindrical target material from positionally shifting and to prevent the bonding material from leaking, it is preferred to vibrate the cylindrical base material to vibrate the bonding material rather than to vibrate the cylindrical target material.

As the method wherein the molten bonding material, which has been filled in the cavity defined by the cylindrical target material and the cylindrical base material, starts to be cooled from one end toward the other end in a cylindrical axis direction in sequence, there is the following method. For example, the method may be conducted such that a plurality of heaters are disposed on an outer peripheral side of the cylindrical target material so as to be independently temperature-controlled, and the entire cylindrical target material is heated by the heaters, followed by starting cooling the bonding material by reducing the intensity of heating or stopping heating from one end toward the other end in a cylindrical axial direction in sequence. In this way, the bonding material is sequentially cooled from the one end toward the other end, being solidified. Although there is no limitation to the cooling rate, the cooling rate is preferably about 0.05 to 3° C./min, more preferably 0.5 to 1.5° C./min since too low a cooling rate lowers productivity while it is likely that too high a cooling rate causes the cylindrical target material to be subjected to a crack due to thermal shock. Although there is no limitation to the temperature gradient when cooling is sequentially conducted from the one end toward the other end, the temperature gradient is preferably about 0.1 to 3° C./cm, more preferably 0.4 to 1° C./cm since too small a temperature gradient makes the temperature control different while too high a temperature gradient is likely to cause the cylindrical target material to be subjected to a crack due to thermal shock. It should be noted that the temperature control is conducted so as to avoid a case where the bonding material is once cooled to its melting point or less, followed by being heated beyond the melting point again. In this way, it is possible to further reduce the occurrence of the bonding layer defect.

Examples of the method for further supplying a molten bonding material during cooling the molten bonding material filled in the cavity defined by the cylindrical ceramic target material and the cylindrical base material include a method for arbitrarily replenishing the molten bonding material and a method for disposing a bonding material supply portion on a top portion of the cavity to store the molten bonding material and supplying the molten bonding material from the supply portion. In order to disposes such a bonding material supply portion, a cylindrical jig, which has a slightly larger inner diameter than the outer diameter of the cylindrical base material may be coupled to a top portion of the cylindrical target material so as to store the molten bonding material in a space defined by the cylindrical jig and the cylindrical base material for example. By adopting this arrangement, it is possible to reduce the bonding layer defect caused during cooling the molten bonding material filled in the cavity defined by the cylindrical ceramic target material and the cylindrical base material. When the molten bonding material is supplied to the cavity during cooling, it is preferred to supply the molten bonding material from the end opposite the one end in the cylindrical axial direction, where cooling starts.

EXAMPLES

Now, the present invention will be described in further detail in reference to examples, but it should be understood that the present invention is by no means thereby restricted.

Example 1

Two cylindrical target materials, which were made of ITO and had an outer diameter of 98 mm, an inner diameter of 78 mm and a length of 175 mm, and one cylindrical base material, which was made of SUS 304 and had an outer diameter of 76 mm, an inner diameter of 70 mm and a length of 470 mm, were prepared. One of the cylindrical target materials and the cylindrical base material were held by a jig such that the bottom end of a lower cylindrical target material was located at a position of 60 mm lower than the bottom end of the cylindrical base material. A sheet made of Teflon (trademark), the other cylindrical target material, a sheet made of Teflon (trademark) and an aluminum jig (having an outer diameter of 98 mm, an inner diameter of 78 mm and a length of 40 mm) were stacked on the one cylindrical target material in this order. An O-ring having a heat resistance (O-ring made of a silicone resin) was disposed on the bottom end of the lower cylindrical target material, and a load of 50 kgf was applied in a cylindrical axial direction from a top portion of the aluminum jig. Four ribbon heaters were wound on outer sides of the cylindrical target materials, and one ribbon heater was wound on the aluminum jig, followed by heating the heaters to 180° C. Then, molten In was poured into from the top of the gap between the aluminum jig and the cylindrical base material. During pouring, an electric vibrator was employed to vibrate the cylindrical base material such that the molten In sufficiently spread into every corner. The vibration acceleration and the vibration amplitude were from 50 to 100 G and from 0.1 to 0.2 mm, respectively. After the molten In was filled up to the top end of the aluminum jig, the temperature given by the four ribbon hearers attached to the cylindrical target materials were lowered by 0.42° C./min at intervals of 30 minutes from a lower portion toward an upper portion of the cylindrical target materials, whereby the temperatures of each cylindrical target material was lowered to 130° C. During lowering the temperature, the aluminum jig was heated so as to be kept at 180° C., whereby the In material filled in between the aluminum jig and the cylindrical base material made of SUS 304 kept a molten state. The aluminum jig corresponds to the bonding material supply portion to store the molten bonding material.

After each cylindrical target material was entirely cooled down to 130° C., the aluminum jig was also cooled down 130° C., followed by cooling down all these members to 25° C. Then, all these members were heated to 50° C. again, and the sheets made of Teflon (trademark) inserted between the cylindrical target materials and between the upper cylindrical target material and the aluminum jig were removed. After that, all these members were cooled down to 25° C., and the aluminum jig and the In material filled in between the aluminum jig and the cylindrical base material made of SUS304 were removed, whereby a cylindrical sputtering target was obtained. The volume ratio of the In material at 25° C. that was filled in the cavity was 100.3% with respect to the volume of the cavity that was defined by each cylindrical target material and the cylindrical base material and had a temperature equal to the melting point of In. An X-ray radiograph was taken by applying an X-ray from outside the cylindrical sputtering target by means of an X-ray irradiation system, and recording an image on a radiographic film affixed on an inner side of the cylindrical base material. It was revealed that the maximum area of portions where no bonding material existed was 0.4 cm$^2$ and that the total area of the portions where no bonding material existed was 0.9 cm$^2$ per 50 cm$^2$ of X-ray radiograph area. A discharge test was carried out for the cylindrical sputtering target under the conditions of a rotation number of 6 rpm, a sputtering pressure of 0.4 Pa and a power density of 4.0 W/cm$^2$. The test results showed that neither a nodule nor extraordinary discharge was generated and that neither a crack nor a chip was observed until the life end.

Example 2

An ITO cylindrical sputtering target was fabricated in the same manner as in Example 1 except that the bonding material was made of InSn, the bonding material had a temperature of 160° C. when being poured, and the first dropping temperature was set at 100° C. The volume ratio of the InSn material at 25° C. that was filled in the cavity was 98.3% with respect to the volume of the cavity that was defined by each cylindrical target material and the cylindrical base material and had a temperature equal to the melting point of InSn. An X-ray radiograph was taken in the same manner as in Example 1. It was revealed that the maximum area of portions where no bonding material existed was 1.0 cm$^2$ and that the total area of the portions where no bonding material existed was 1.9 cm$^2$ per 50 cm$^2$ of X-ray radiograph area. A discharge test was carried out for this ITO cylindrical sputtering target under the same conditions as in Example 1. The test results showed that neither a nodule nor extraordinary discharge was generated and that neither a crack nor a chip was observed until the life end.

Example 3

An AZO cylindrical sputtering target was fabricated in the same manner as in Example 1 for that a cylindrical target material was made of AZO. The volume ratio of the In material at 25° C. that was filled in the cavity was 100.2% with respect to the volume of the cavity that was defined by each cylindrical target material and the cylindrical base material and had a temperature equal to the melting point of In. An X-ray radiograph was taken in the same manner as in Example 1. It was revealed that the maximum area of portions where no bonding material existed was 0.5 cm$^2$ and that the total area of the portions where no bonding material existed was 1.2 cm$^2$ per 50 cm$^2$ of X-ray radiograph area. A discharge test was carried out for this AZO cylindrical sputtering target under the same conditions as in Example 1. The test results showed that neither a nodule nor extraordinary discharge was generated and that neither a crack nor a chip was observed until the life end.

Example 4

An ITO cylindrical sputtering target was fabricated in the same manner as in Example 1 except that weak vibration was given when pouring the bonding material. In this Example, the vibration acceleration and the vibration amplitude were from 0.1 to 6 G and from 0.01 to 0.03 mm, respectively. The volume ratio of the In material at 25° C. that was filled in the cavity was 96.8% with respect to the volume of the cavity that was defined by each cylindrical target material and the cylindrical base material and had a temperature equal to the melting point of In. An X-ray radiograph was taken in the same manner as in Example 1. It was revealed that the maximum area of portions where no bonding material existed was 1.5 cm$^2$ and that the total area of the portions where no bonding material existed was 3.1 cm$^2$ per 50 cm$^2$ of X-ray radiograph area. A discharge test was carried out for this ITO cylindrical sputtering target under the same conditions as in Example 1. The test results showed that neither a nodule nor extraordinary discharge was generated and that neither a crack nor a chip was observed until the life end.

Example 5

An ITO cylindrical sputtering target was fabricated in the same manner as in Example 1 except that no aluminum jig was employed. The volume ratio of the In material at 25° C. that was filled in the cavity was 93.2% with respect to the volume of the cavity that was defined by each cylindrical target material and the cylindrical base material and had a temperature equal to the melting point of In. An X-ray radiograph was taken in the same manner as in Example 1. It was revealed that the maximum area of portions where no bonding material existed was 7.0 cm$^2$ and that the total area of the portions where no bonding material existed was 7.5 cm$^2$ per 50 cm$^2$ of X-ray radiograph area. A discharge test was carried out for this ITO cylindrical sputtering target under the same conditions as in Example 1. The test results showed that although a quite small number of nodules were produced, such a quite small number of nodules had no adverse effect to use, and that neither a crack nor a chip was observed until the life end.

Comparative Example 1

An ITO cylindrical sputtering target was fabricated in the same manner as in Example 1 except that no aluminum jig was employed and the temperatures of the four ribbon heaters on the cylindrical target materials were simultaneously dropped by 0.42° C./min to uniformly cool down each ITO cylindrical target material in its entirety. The volume ratio of the In material at 25° C. that was filled in the cavity was 87.6% with respect to the volume of the cavity that was defined by each cylindrical target material and the cylindrical base material and had a temperature equal to the melting point of In. An X-ray radiograph was taken in the same manner as in Example 1. It was revealed that the maximum area of portions where no bonding material existed was 5.8 cm$^2$ and that the total area of the portions where no bonding material existed was 10.6 cm$^2$ per 50 cm$^2$ of X-ray radiograph area. A discharge test was carried out for this ITO cylindrical sputtering target in the same manner as in Example 1. The test results showed that nodules were produced during discharge, that extraordinary discharge was generated and that a crack occurred in use.

Comparative Example 2

An ITO cylindrical sputtering target was fabricated in the same manner as in Comparative Example 1 except that no vibration was given when pouring molten In. The volume ratio of the In material at 25° C. that was filled in the cavity was 82.1% with respect to the volume of the cavity that was defined by each cylindrical target material and the cylindrical base material and had a temperature equal to the melting point of
In. An X-ray radiograph was taken in the same manner as in Example 1. It was revealed that the maximum area of portions where no bonding material existed was 9.7 cm$^2$ and that the total area of the portions where no bonding material existed was 12.5 cm$^2$ per 50 cm$^2$ of X-ray radiograph area. A discharge test was carried out for this ITO cylindrical sputtering target in the same manner as in Example 1. The test results showed that nodules were produced during discharge, that extraordinary discharge was generated and that a crack occurred in use.

INDUSTRIAL APPLICABILITY

The cylindrical ceramic sputtering target produced according to the production method of the present invention can minimize the occurrence of a crack, a chip, extraordinary discharge and a nodule in use, and obtain a high target utilization ratio and a high film deposition rate, being appropriately applied to flat panel displays.

The entire disclosure of Japanese Patent Application No. 2008-152061 filed on Jun. 10, 2008 including specification, claims, drawings and summary is incorporated herein by reference in its entirety.

EXPLANATION OF REFERENCE NUMERALS

1: Cylindrical target material
2: Cylindrical base material
3: Cavity defined by the cylindrical target material and the cylindrical base material

The invention claimed is:
1. A process for producing a cylindrical ceramic sputtering target comprising a bonding material filled in a cavity defined by a cylindrical ceramic target material and a cylindrical base material wherein the cylindrical base material is disposed inside the cylindrical ceramic target material, wherein as observed by an X-ray radiograph of the bonding material, the total area of portions where no bonding material exists is 10 cm$^2$ or less per 50 cm$^2$ of X-ray radiograph area, and the maximum area of the portions where no bonding material exists is 9 cm$^2$ or less and wherein the volume ratio of the bonding material at 25° C. that is filled in the cavity is at least 96.8% with respect to the volume of the cavity at the melting point of the bonding material, said process comprising filling a molten bonding material in a cavity, starting cooling the molten bonding material from its one end toward its other end in a cylindrical axial direction in sequence, further filling the molten bonding material in the cavity during cooling and further comprising vibrating the molten bonding material filled in the cavity when or after filling the bonding material in the cavity.

2. The method according to claim 1, further comprising supplying the molten boding material from an end opposite the one end in the cylindrical axial direction where cooling starts.

3. The method according to claim 1, further comprising filling the molten bonding material by supplying, during cooling, the molten bonding material from a bonding material supply portion to store the molten bonding material.

* * * * *